US006878916B2

(12) United States Patent
Schuster

(10) Patent No.: US 6,878,916 B2
(45) Date of Patent: Apr. 12, 2005

(54) METHOD FOR FOCUS DETECTION FOR OPTICALLY DETECTING DEVIATION OF THE IMAGE PLANE OF A PROJECTION LENS FROM THE UPPER SURFACE OF A SUBSTRATE, AND AN IMAGING SYSTEM WITH A FOCUS-DETECTION SYSTEM

(75) Inventor: Karl-Heinz Schuster, Koenigsbronn (DE)

(73) Assignee: Carl Zeiss SMT AG, Oberkochen (DE)

( * ) Notice: Subject to any disclaimer, the term of this patent is extended or adjusted under 35 U.S.C. 154(b) by 46 days.

(21) Appl. No.: 10/210,051

(22) Filed: Aug. 2, 2002

(65) Prior Publication Data

US 2004/0000627 A1 Jan. 1, 2004

(30) Foreign Application Priority Data

Jun. 28, 2002 (DE) ........................................ 102 29 818

(51) Int. Cl.[7] .............................................. G02B 27/40
(52) U.S. Cl. ........................................ 250/201.2; 35/55
(58) Field of Search ........................ 250/201.2–201.8, 250/548, 559.29; 355/53, 55

(56) References Cited

U.S. PATENT DOCUMENTS

| 4,870,452 | A | * | 9/1989 | Tanimoto et al. .............. 355/53 |
| 5,191,200 | A | | 3/1993 | van der Werf et al. |
| 5,783,833 | A | | 7/1998 | Sugaya et al. |
| 5,825,469 | A | * | 10/1998 | Nam et al. ..................... 355/55 |

FOREIGN PATENT DOCUMENTS

| DE | 198 29 513 C2 | 1/2000 |
| EP | 1 187 186 A1 | 3/2002 |
| JP | 10148947 A | 6/1998 |

OTHER PUBLICATIONS

J.E. van der Werf, "Optical Focus and Level Sensor for Wafer Steppers", American Vacuum Society, Mar./Apr. 1992, J.Vac. Sci. Technol. B 10(2), pp. 735–740.

* cited by examiner

Primary Examiner—Thanh X. Luu
(74) Attorney, Agent, or Firm—Sughrue Mion, PLLC

(57) ABSTRACT

A microlithographic projection illumination system has a focus-detection system for optically detecting deviations of the image plane of a projection lens from the upper surface of a substrate arranged in the vicinity of its image plane. The focus-detection system has a system for coupling in at least one measuring beam that is obliquely incident on, and to be reflected at, the substrate surface into an intermediate zone between the final optical surface of the imaging system and the substrate surface and a system for coupling out the measuring beam and detecting it following its reflection at the substrate surface. The system for coupling the measuring beam in and the system for coupling it out are configured such that the measuring beam is reflected at least once at the substrate surface and at least once at a reflecting surface of the imaging system that reflects the light employed for measurement purposes before the measuring beam enters the system for coupling it out, which allows employing the image side of the imaging system as part of the focus-detection system. The focus-detection system also operates reliably when used on ultrahigh-aperture lenses that have correspondingly short working distances.

45 Claims, 4 Drawing Sheets

METHOD FOR FOCUS DETECTION FOR OPTICALLY DETECTING DEVIATION OF THE IMAGE PLANE OF A PROJECTION LENS FROM THE UPPER SURFACE OF A SUBSTRATE, AND AN IMAGING SYSTEM WITH A FOCUS-DETECTION SYSTEM

The following disclosure is based on German Patent Application No. 102 29 818.1 filed on Jun. 28, 2002, which is incorporated into this application by reference.

BACKGROUND OF THE INVENTION

1. Field of the Invention

The invention relates to a method for optically detecting deviations of the image plane of an optical imaging system from the upper surface of a substrate to be arranged in the vicinity of that image plane and an imaging device, in particular, a projection exposure system for use in microlithography, that has an optical imaging system and a focus-detection system for carrying out the method.

2. Description of the Related Art

Projection exposure systems for use in microlithography have been employed for fabricating semiconductor devices and other types of microdevices for several decades. They serve to image patterns on masks, or reticles, onto a substrate coated with a photosensitive layer at ultrahigh resolution, on a reduced scale, using an optical imaging system, their projection lens, where the upper surface of the substrate must coincide with the image plane of the imaging system as closely as possible if imaging is to be uniformly sharp over the entire image field.

In order to create even finer features of order 100 nm and finer, projection lenses operating with ultraviolet light that have high image-side numerical apertures, NA, of, e.g., NA=0.8 or better, and correspondingly shallow depths of field are employed, which imposes particularly stringent demands on the accuracy with which the substrates to be exposed are positioned in relation to the image plane.

Alignment systems are used for positioning substrates along directions (the x-direction and y-direction) orthogonal to the optical axis. Focus-detection systems, which are also termed "focus sensors," are used for optically detecting deviations of the substrate's upper surface from the image plane parallel to the optical axis (the z-direction) and any tilting of the substrate's upper surface. Several of those systems have an optical input-coupling system for obliquely injecting at least one measuring beam to be reflected at the substrate's upper surface into a slit-shaped intermediate expanse situated between a final optical surface of an imaging system and the substrate's upper surface and an output-coupling system for detecting the measuring beam following its reflection at the substrate's upper surface. In the case of systems of this type, the measuring beam is incident on the substrate's upper surface at an acute angle of incidence and reflected. The measuring beam, which is detected and may be utilized for determining the position and, if necessary, the orientation, of the substrate' upper surface, will be offset by an amount that will depend upon the height of the substrate's upper surface in the z-direction and any tilting of the substrate's upper surface.

U.S. Pat. No. 5,783,833 describes a focus sensor of that type that employs grazing incidence of the light employed for measurement. However, the problem that, in the case of imaging systems with high numerical apertures and correspondingly short working distances between their exit surfaces of their lenses and the substrate's upper surface, not much space remains available, so that a focusing beam cannot be directed at the substrate's upper surface at a sufficiently large angle of incidence, is pointed out. It is therefore assumed that focus-detection systems employing light incident at oblique angles of incidence may be employed on projection lenses having moderate numerical apertures and correspondingly large working distances only.

U.S. Pat. No. 5,191,200 describes other microlithographic projection lenses having focus and tilt sensors. In addition to embodiments wherein light incident at grazing angles is reflected at the substrate's upper surface only, there also are embodiments wherein a transparent reference plate whose exit surface is utilized as a reflecting surface for light employed for measurement that is obliquely incident from below is arranged beneath the final lens element of the projection lens. These focus-detection systems also require relatively large working distances between the final optical surface of the imaging system and the upper surface of the substrate to be positioned.

Furthermore, there are focus sensors that utilize the wave nature of light. Measuring beams are normally incident outside that area of the substrate to be exposed, whose location in the z-direction is determined using interference.

SUMMARY OF THE INVENTION

It is one object of the invention to provide a method for optically detecting deviations of the upper surface of a substrate to be arranged in the vicinity of the image plane of an optical imaging system and the image plane of the optical imaging system and an associated focus-detection system that are suitable for use with microlithographic projection lenses having high image-side numerical apertures and correspondingly short working distances and suitable for use in the region of the surfaces of the substrates to be exposed.

As a solution to these and other objects the invention, according to one formulation, provides a method for optically detecting deviations of the image plane of an optical imaging system from the substrate surface of a substrate to be arranged in the vicinity of the image plane comprising:
generating at least one measuring beam of measuring light;
obliquely irradiating an intermediate zone situated between a final optical surface of the imaging system and the substrate surface with the measuring beam;
detecting the measuring beam subsequent to reflection of the measuring beam at the substrate surface;
wherein that irradiation is carried out such that the measuring beam is reflected at least once at the substrate surface and at least once at a reflecting surface of the imaging system that reflects the measuring light, prior to detection of the measuring beam.

An associated imaging device having an optical imaging system and a focus-detection system for optically detecting deviations of the image plane of an optical imaging system from the surface of a substrate to be arranged in the vicinity of the image plane, the focus-detection system comprises:
an input-coupling system for coupling in at least one measuring beam of measuring light provided for reflection on the substrate surface obliquely into an intermediate zone located between the final optical surface of the imaging system and the substrate surface and
an output-coupling system for coupling the measuring beam out and detecting the measuring beam subsequent to reflection at the substrate surface, wherein the input-coupling system and the output-coupling system are configured such that the measuring beam is reflected at least once at the substrate surface and at least once at a reflecting surface of the imaging system that reflects the measuring light before the measuring beam enters the output-coupling system.

In accordance with the invention, it is thus provided that a measuring beam traveling between the input-coupling system and the output-coupling system is reflected back and forth along a zigzag between the substrate surface, for example, a layer of photoresist applied to a wafer, and the end of the optical imaging system facing its image plane, which allows directing the measuring beam at the reflecting surface of the substrate at relatively large angles of incidence, even if the distance between the imaging system and the substrate surface is short. "Angle of incidence," as used here, is defined as the angle between the direction of incidence of the measuring beam at the location on the substrate surface at which it is reflected and the substrate surface. The invention thus allows employing focus-detection systems that operate at grazing incidence, even with projection lenses that have very short working distances, in particular, with projection lenses that have ultrahigh numerical apertures, NA, in excess of, for example, NA=0.8 or 0.9. In contrast to the situation that applies under the state of the art, the invention allows employing angles of incidence larger than the arctangent of the ratio of the working distance to the radius of the rim of the exit surface of the imaging system.

Although a measuring beam might well strike the substrate's upper surface (i.e. the substrate surface) at several, widely spaced, locations, it is preferable that the measuring beam be guided such that it is reflected just once at the substrate's upper surface. The z-position and, if necessary, the orientation of the substrate's upper surface, may then be reliably determined for this single reflection location, which may be either centered on the optical axis or off-axis. The number of reflections at one or more suitable reflecting surfaces of the imaging system may be chosen, regardless of the particular application involved, and may be, for example, one or two.

For many types of measurement configurations, it will be particularly beneficial if the measuring beam is guided such that at least one auxiliary reflector having at least one reflecting surface for reflecting a measuring beam that is directed toward the substrate's upper surface at an oblique angle at a direction that is directed away from the substrate's upper surface at an oblique angle is provided in front of the substrate's upper surface, and at a distance therefrom. This auxiliary reflecting surface may be in the form of, for example, a mirror or a prism that is permanently mounted at a suitable location on the imaging system or, if necessary, a part of the optics of the focus-detection system mounted such that it may be moved. This auxiliary reflecting surface may, for example, be arranged between the plane defined by the exit surface of the imaging system and the plane of the substrate's upper surface, which will allow reflecting a measuring beam directed at the auxiliary reflecting surface from that surface to, firstly, the reflecting surface of the imaging system, and then from there to the desired reflection location on the substrate's upper surface, from which it may then enter the output-coupling optics, either directly, or via further deflections and/or reflections. One or more such auxiliary reflecting surfaces may be provided. In the case of embodiments where the light employed for measurement is coupled into the final optical component of the imaging system, this auxiliary reflecting surface may also be provided on the final optical surface of the imaging system.

Since detection of the position and/or orientation of the substrate's upper surface in accordance with the invention also utilizes the vicinity of the image-side exit of the optical imaging system for deflecting the measuring beam, it will be preferable if a final optical component of the optical imaging system has an exit surface that has at least one section that has a coating that reflects the light employed for measurement, which will minimize intensity losses that occur upon reflection of the light employed for measurement at the imaging system in order that strong, useful, signals will be obtainable. This coating should preferably be transparent to the light employed for making exposures, i.e., at the operating wavelength of the optical imaging system, in order that it will have no effect on the imaging of the focus-detection system. It will be particularly beneficial if this coating reduces reflections or is antireflection coated for the operating wavelength, or the wavelength employed for making exposures, in order that imaging and focus detection may be optimized for high efficiency, without any interfering interactions. The wavelength employed for making exposures will preferably be one falling within the UV spectral region, for example, the region below about 260 nm, in particular, 193 nm or 157 nm. The wavelength employed for measurement may be one falling within the visible spectral region, e.g., 633 nm.

One embodiment of the invention yields an improvement in metric responsivity by guiding the measuring beam such that it traverses a beam path that includes at least one reflection at the substrate's upper surface and at least one reflection at a reflecting surface of the optical imaging system several times, for example, two times or four times, prior to its detection. One embodiment of the focus-detection system thus has at least one retroreflector for reflecting the measuring beam on itself, which will allow significantly improving metric responsivity.

Further beneficial configurations will be possible if the polarization properties of light are duly taken into account when designing the focus-detection system. Embodiments whose input-coupling system is designed to output polarized light allow, for example, using light that has a preferred polarization direction that is substantially orthogonal to the place of incidence of the measuring beam on the reflecting surfaces for measurement purposes. Utilizing largely s-polarized components of the electric field allows utilizing reflecting surfaces under circumstances under which they have very high reflectances, which allows improving both metric accuracy and metric responsivity. The measuring-beam path may also be alternately traversed by s-polarized and p-polarized light, particularly in the case of embodiments that have multipass measuring-beam paths. In order to allow that, one embodiment is provided with a polarization rotator for rotating the preferred polarization direction of the light employed for measurement between a first traverse of the measurement path and a subsequent, second, traverse of the measurement path that is traversed in the opposite direction. This approach also allows multipassing a measuring-beam path more than twice, for example, four times, using light having differing preferred polarization directions when polarization-selective optical components are employed.

Particularly beneficial beam-guidance geometries may then result if the image-side end of the optical imaging system is utilized as a beam-guidance component of the focus-detection system. On such embodiments, the input-coupling system and/or output-coupling system comprises the final optical component of the imaging system that is closest to the image plane and has planar interfaces, where an oblique coupling of a measuring beam into that optical component is performed such that the measuring beam is reflected at least once at a planar interface of that optical component before it exits that optical component. At least two reflections, in particular, reflections at facing planar surfaces, should preferably provided in order that a zigzag beam path may occur within that final optical component. In order to simplify coupling the measuring beam into that final optical component, that final optical component should preferably have a boundary zone on which a planar surface inclined at an angle to the optical axis, where the normal to that surface is preferably oriented parallel to the desired input-coupling direction, for coupling in the measuring beam is formed at least one location. The measuring beam may then be reflected between a substantially planar entry surface of that optical component and planar zones on its facing exit surface, coupled out at a suitable location on its exit surface, coupled back into the optical component after being reflected at the substrate's upper surface, and then coupled back out the optical component following further reflections at its interfaces, if necessary. A special inclined surface on that surface of the optical component that couples it in may be provided for coupling it out. If necessary, a suitably prepared location on the final optical component may also retroreflect the measuring beam on itself in order to obviate need for a special surface for coupling it out, in which case, the surface that couples it in may also be employed for coupling it out. It will be beneficial if the final optical component is configured in the form of a plane-parallel plate that may be optically contacted onto the exit surface of a final lens element.

Further opportunities for improving metric responsivity may result from judicious choices of the objects to be imaged. If the input-coupling optics merely have to image just a slit, or some other object that is spatially extended in essentially one dimension only, onto a reflection location on the substrate's upper surface, low angles of incidence on the substrate's upper surface will be readily accommodatable. However, for detecting tilting, it might be better to if objects that are spatially extended in two dimensions are imaged onto the substrate's upper surface and their reflections detected, in which case employing, for example, moiré techniques and analyzing the results obtained over extended areas, will allow significantly improving analytical accuracies.

A preferred embodiment thus provides that the input-coupling system includes an object grid that may be imaged onto the substrate's upper surface by imaging optics and that the output-coupling system includes an analysis grid and imaging optics for imaging the grid imaged onto the substrate onto the analysis grid. These grids are adapted to suit one another such that a moiré fringe pattern may be created when the object grid is imaged onto the analysis grid. Particularly beneficial and adapted to suit the obliquely incident light are embodiments wherein object grids having a perspective distortion are employed and the corresponding analysis grids also have a perspective distortion, where the distortions of the object grids and analysis grids are adapted to suit one another such that they also will allow creating moiré fringe patterns. For example, employing a trapezoidal object grid will allow creating a grid consisting of parallel lines or two sets of parallel lines having mutually orthogonal periodicity directions on the substrate's upper surface when illuminated at an oblique angle of incidence. If the imaging optics, input-coupling optics, and output-coupling optics employed all have the same focal length, then the analysis grid may have the same dimensions and layout as the object grid, which will allow fabricating them very inexpensively. If a phase shift is to be performed in conjunction with the moiré measurements, then the associated translation devices for translating the analysis grid and object grid relative to one another in order to create periodically varying signal levels from the superimposed patterns will have to be provided.

The aforementioned and other features of the invention are as stated in the accompanying claims, description, and drawings, where the individual features thereof may represent themselves alone or several such in the form of combinations of subsets thereof that appear in an embodiment of the invention and have been implemented in other fields, and may represent beneficial embodiments that may themselves be inherently patentable.

DETAILED DESCRIPTIONS OF THE DRAWINGS

DETAILED DESCRIPTION OF THE INVENTION

Figure 1:
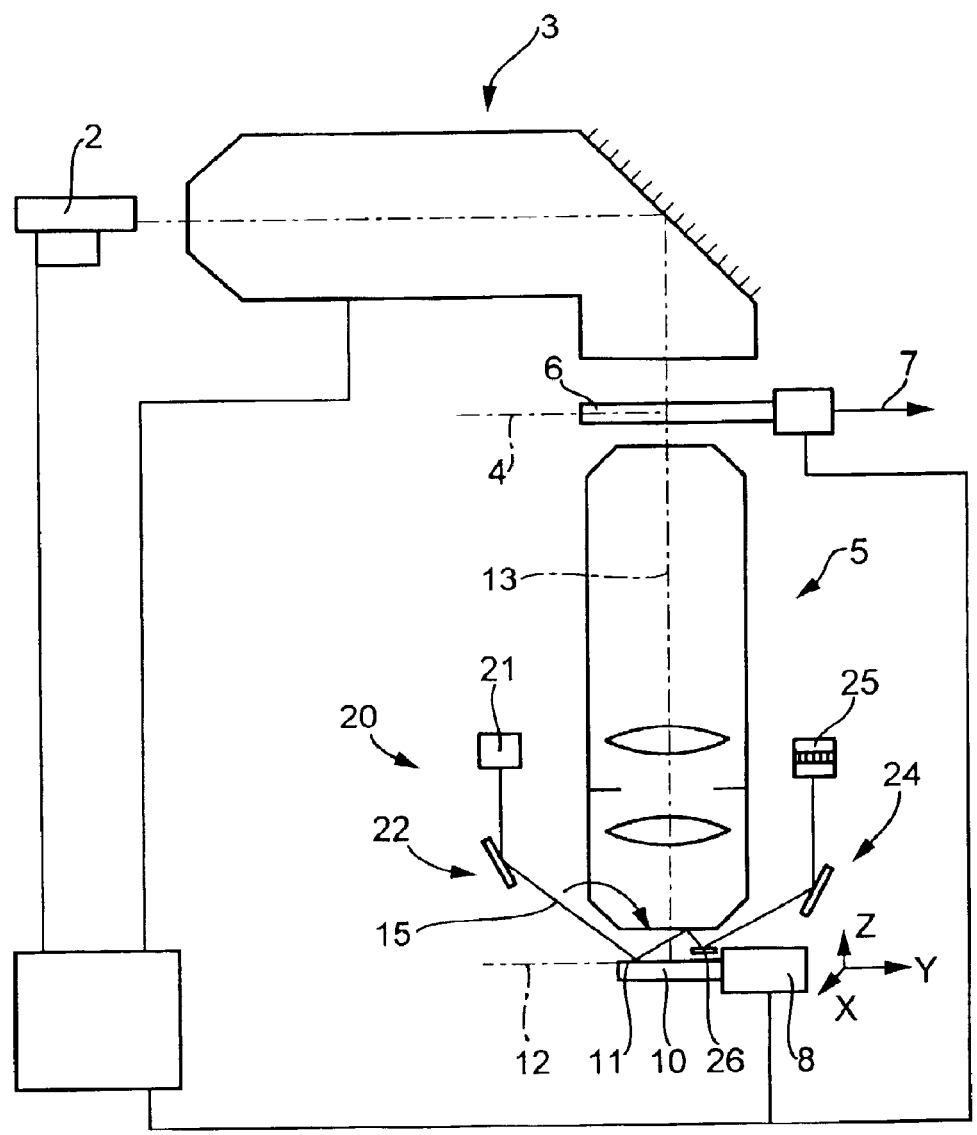
FIG. 1 is a schematized depiction of a microlithographic projection exposure system equipped with an embodiment of a focus-detection system according to the invention.

FIG. 1 schematically depicts a microlithographic projection exposure system 1 in the form of a wafer stepper employed for fabricating VLSI semiconductor devices. The system includes an excimer laser 2 having an operating wavelength of 157 nm, where other operating wavelengths, for example, 193 nm or 248 nm, are also possibilities, that serves as its light source. An illumination system 3 that follows the excimer laser in the optical train generates a large, sharply delimited, and highly uniformly illuminated image field that has been adapted to suit the telecentricity requirements of the projection lens 5 that follows it in the optical train in its image plane 4. The illumination system 3 is equipped with devices for selecting an illumination mode and, in the case of the example shown, is capable of being switched between conventional illumination with a variable degree of spatial coherence, annular illumination, and dipole or quadrupole illumination. The illumination system is followed by a device for clamping and manipulating a mask 6 that is arranged such that the mask lies in the object plane 4 of the projection lens 5 and may be translated along a direction of travel 7 lying in that plane in order to allow scanning operation.

The image plane 4, which is also termed the "mask plane," is followed by the reduction lens 5, which projects, on a reduced scale, for example, a scale of 1:4 or 1:5, an image of the mask onto a wafer 10 coated with a layer of photoresist. The wafer 10, which serves as a substrate, is arranged such that its planar upper surface (substrate surface) 11 bearing the layer of photoresist substantially coincides with the image plane 12 of the reduction lens 5. The wafer is held in place by a device 8 that includes a scanning drive in order to allow to allow synchronously translating the wafer parallel to the mask 6. That device 8 also included manipulators in order to allow translating the wafer in both the z-direction, i.e., parallel to the optical axis 13 of the projection lens, and the x-direction and y-direction, which are orthogonal to that axis.

Figure 2:
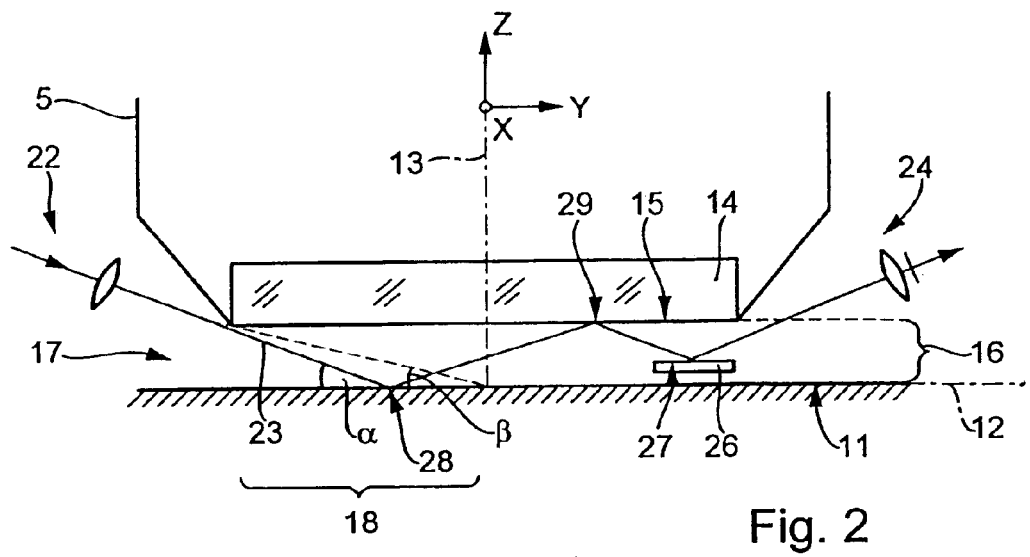
FIG. 2 is an enlarged schematized depiction of part of the focus-detection system shown in FIG. 1.

The projection lens 5 has a plane-parallel plate 14 whose planar exit surface 15 represents the final optical surface of the projection lens 5 and is arranged at a working distance 16 above the upper surface 11 of the substrate (cf. FIG. 2), as its final transparent component, i.e., the surface closest to its image plane 12. Due to the high image-side numerical aperture of the projection lens 5 of more than 0.80, the gas-filled intervening space or intermediate zone 17 between its exit surface 15 and the upper surface of the substrate 11 is very narrow, and may be as narrow as 1 mm or less.

The projection exposure system includes an alignment system that will not be described in any detail here in order to allow accurately aligning the wafer 10 in relation to the image of the mask by adjusting its positioning along the x-direction and the y-direction. The projection exposure system also includes a focus-detection system 20 for optically detecting deviations of the upper surface 11 of the wafer 10, which is to be arranged in the vicinity of the image plane 12 of the optical imaging system formed by the projection lens 5 from its image plane. The location of the wafer 10 relative to the projection lens 5 may be corrected based on the results of measurements obtained using the focus-detection system 20 by, for example, either employing suitable methods for translating the wafer along the z-direction or translating the projection lens along the optical axis 13 relative to the wafer holder 8.

The focus-detection system 20 includes a light source 21, input-coupling optics 22 for obliquely directing at least one measuring beam 23 into the intervening space 17 between the projection lens 5 and the wafer 10, output-coupling optics 24 for detecting the measuring beam following its reflection at the upper surface 11 of the substrate, and a detector unit 25 for the spatially resolved detection of the measuring beam following its interaction with the upper surface 11 of the substrate. An auxiliary mirror 26 that has an auxiliary reflecting surface 27 that is aligned parallel to the image plane 12 and arranged between the upper surface 11 of the wafer and the exit end 15 of the projection lens is also provided. That auxiliary mirror 26 may be mechanically fastened either to a component, for example, the output-coupling optics 24, of the focus-detection system 20 or to the projection lens 5. A special mount may also be employed.

The components of the input-coupling optics 22 are arranged such that the exiting measuring beam initially obliquely strikes a reflection location 28 on the upper surface 11 of the substrate that is eccentrically disposed with respect to the optical axis 13 at an angle of incidence, α. From there, the measuring beam is reflected in the direction of the exit surface 15, where it is reflected to a reflection location 29 that is eccentrically disposed with respect to the optical axis 13. This exit surface 15 has a coating that is antireflective at the operating wavelength of the projection lens, which lies in the deep-ultraviolet spectral region, and is reflective at the wavelength of the measuring beam 23, which lies in the visible spectral region, for example, at 633 nm, applied to it. The measuring beam will thus be obliquely reflected in the direction of the upper surface 11 of the substrate and strike the reflecting surface 27 of the auxiliary mirror arranged at a distance above the upper surface of the substrate, which will deflect the measuring beam into the output-coupling optics 24. There will thus be a single reflection at the location 28 on the upper surface 11 of the substrate and an auxiliary reflection at the planar exit surface 15 of the photolithographic projection lens, where both reflections involve the same measuring beam. The auxiliary mirror 26 prevents the beam from striking the wafer 10 a second time, which would be undesirable.

Since the exit end of the projection lens is employed as a reflecting element of the focus-detection system, the measuring beam 23 may be injected at an angle of incidence, α, that is greater than the fringing angle, β, which represents the maximum possible angle of incidence for conventional focus-detection systems that employ grazing incidence and equals the arctangent of the ratio of the working distance 16 to the radius 18 of the rim of the exit surface 15.

A second embodiment, wherein the focus-detection system utilizes a single reflection at the substrate's upper surface and two reflections at the exit surface of a projection lens will be discussed, based on FIG. 3. The layout of light source, input-coupling system, output-coupling system, and detector may be similar to, or identical to, the layout shown in FIG. 1. The system includes two prisms 126' and 126" whose reflective base surfaces 127', 127" are arranged outside the final surface 115 of the projection lens, in the space between the upper surface 111 of the substrate and the plane passing through the final surface of the lens 115, that are symmetrically arranged about the optical axis 113 and serve as auxiliary reflecting surfaces. These prisms 126' and 126" are rigidly attached to the lens' mount 105 and mounted a short distance above the upper surface 111 of the wafer. The system allows using a symmetric beam path for the measuring beam 123 that has a single reflection at the upper surface 111 of the wafer, which takes place at a location 128 that coincides with the optical axis 113, and is thus concentric with the optical axis, where the measuring beam is obliquely injected into the first prism 126, whose base surface 127 reflects the beam to the exit surface 115, to which a coating that is antireflective at the operating wavelength and reflective at the wavelength employed for measurement is applied, by the input-coupling optics. The reflected beam is then reflected at the location 126 on the wafer and once again strikes the final surface 115, which reflects it into the prism 126, which reflects it in the direction of the detector unit 125.

Figure 3:
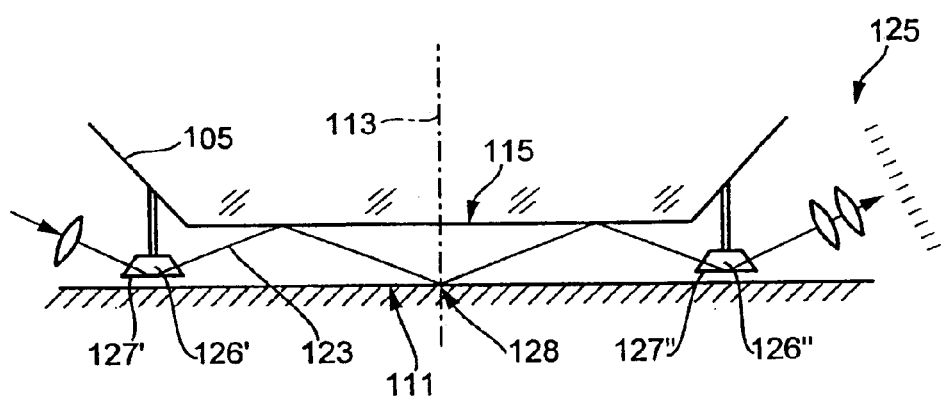
FIG. 3 is a schematized depiction of part of a second embodiment of a focus-detection system according to the invention.
Figure 4:
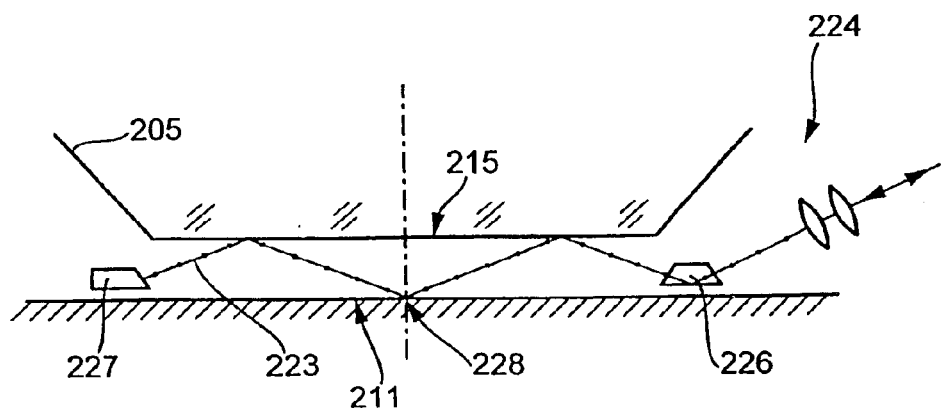
FIG. 4 is a schematized depiction of part of a third embodiment of a focus-detection system according to the invention.

In the case of those systems shown in FIGS. 1 and 3, the light employed for measurement traverses the path traversed by the measuring beam once only. A third embodiment where the path traversed by the measuring beam is traversed twice will be discussed, based on FIG. 4. Its focus-detection system includes an optical system 224 that both couples the measuring beam 223 into the focus-detection system and couples it out of the focus-detection system. A prism 226 whose base surface is parallel to the image plane and serves as an auxiliary reflecting surface that obliquely deflects the light employed for measurement in the direction of the substrate's upper surface is arranged on the side of the input/output-coupling optics 224, between the plane of the planar exit surface 215 of the projection lens 205 and the upper surface 211 of the substrate. Following a total of two reflections at the exit surface 215 and a single reflection in the vicinity of the upper surface 211 of the substrate, the light employed for measurement strikes a concave end mirror 227 that essentially reflects incident light on itself, so the light employed for measurement will be reflected back to the input/output-coupling optics, following two further reflections at the exit surface 215 and a single, reflection at a location 228 on the upper surface of the wafer that coincides with the optical axis.

The light that this system employs for measurement is polarized light whose preferred polarization direction is orthogonal to its plane of incidence on those locations at which it is reflected (s-polarized light). The double traverse of the path of the measuring beam improves the responsivity of the metrological system. Selecting s-polarized light allows utilizing the reflecting surfaces situated in the path of the measuring beam under circumstances under which they have high reflectances, which minimizes intensity losses and improves metric accuracy along the z-direction. Furthermore, the results of measurements will no longer be adversely affected by phase shifts between s-polarized and p-polarized components, which may occur when unpolarized light is reflected at the surfaces of the various individual components of the focus-detection system and the upper surface of the wafer.

Employing suitable input light will also allow conducting measurements utilizing exclusively p-polarized light, where, in this particular case, due attention should be devoted to making certain that the angles of incidence involved are either much greater, or much less, to sufficient degrees, than the respective Brewster angles at those locations where reflections occur in order to minimize reflection losses.

Figure 5:
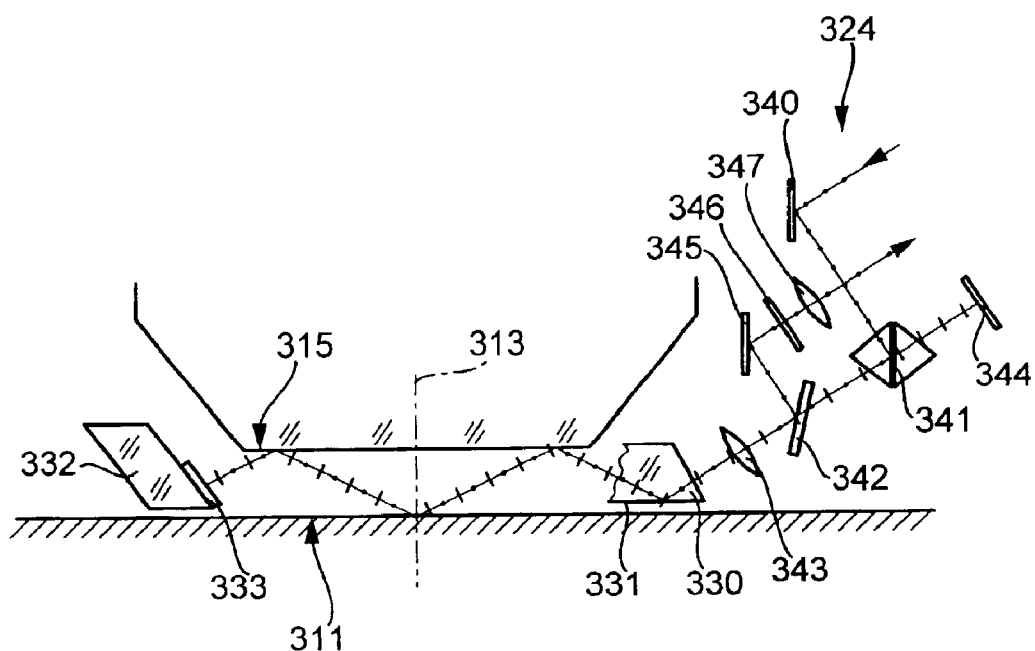
FIG. 5 is a schematized depiction of part of a fourth embodiment of a focus-detection system according to the invention.

An embodiment that allows a fourfold traversal of the path of the measuring beam for a single reflection at the center of the upper surface of the substrate by virtue of its employing polarized light in conjunction with a retroreflector will be discussed, based on FIG. 5. The focus-detection system includes combined, polarization-selective, input/output-coupling optics 324, a deflecting prism 330 whose base surface 331 serves as an auxiliary reflecting surface and that is arranged above the upper surface 311 of the substrate, between that surface and a plane passing through the lens' exit surface 315, and a retroreflector 332 that is combined with a polarization rotator 333 in the form of a λ/4-plate. Its input/output-coupling optics 324 include a first mirror 340, a polarization beamsplitter having a polarization-selective beamsplitting surface 341, a polarization-selective intensity splitter 342, collimating optics 343, a second mirror 344, a third mirror 345, a polarization filter 346, and collimating optics 347.

Light from a laser source that is s-polarized with respect to its plane of incidence on the first mirror 340 is deflected in the direction of a polarization-selective beamsplitting surface 341 by the first mirror, which deflects it through the intensity splitter 342 and collimating optics 343 into the deflecting prism 330. Light obliquely incident on the substrate's upper surface is deflected in the direction of the exit surface 315 of the projection lens by the base surface 331 of the prism such that it will be reflected at the exit surface of the projection lens and strike the upper surface 311 of the substrate, which respect to which is also s-polarized, in the vicinity of the optical axis 313. Following its reflection at the upper surface 311 of the substrate and a second reflection at the exit surface 315, the measuring beam passes through the λ/4-plate 333, which converts the circularly polarized light into light that is now p-polarized with respect to the measuring beam's transmission plane. Up to the intensity splitter 342, this p-polarized light traverses the same path as the measuring beam, which includes two reflections at the exit surface 315 and a reflection at a center of the upper surface 311 of the substrate. The polarization-sensitive intensity splitter 342, which transmits p-polarized light, transmits the measuring beam toward the beamsplitting surface 341, which transmits the p-polarized beam to the second mirror 344, which reflects the beam on itself. The beam path up to the retroreflector 344 is then traversed with p-polarization before the return path is traversed with s-polarization up to the intensity splitter 342, following a two-fold λ/4-retardation. The intensity splitter then reflects the s-polarized light to the third mirror 345, which deflects it in the direction of the polarization filter 346 and the collimating optics 347 that follow the latter in the optical train, and to the spatially resolving detector, which is not shown here. The polarization filter 346 removes residual p-polarization components from the measuring beam in order that exclusively s-polarized light will enter the detector. It will be beneficial to configure the layout such that the angles of incidence involved will be either much greater than, or much less than, the Brewster angle at those locations where reflections occur in order to limit intensity losses that occur on reflection of p-polarized light. In the case of this particular embodiment, more than two, namely four, reflections of light that is alternately s-polarized and p-polarized occur, one after the other, at the upper surface 311 of the substrate.

Figure 6:
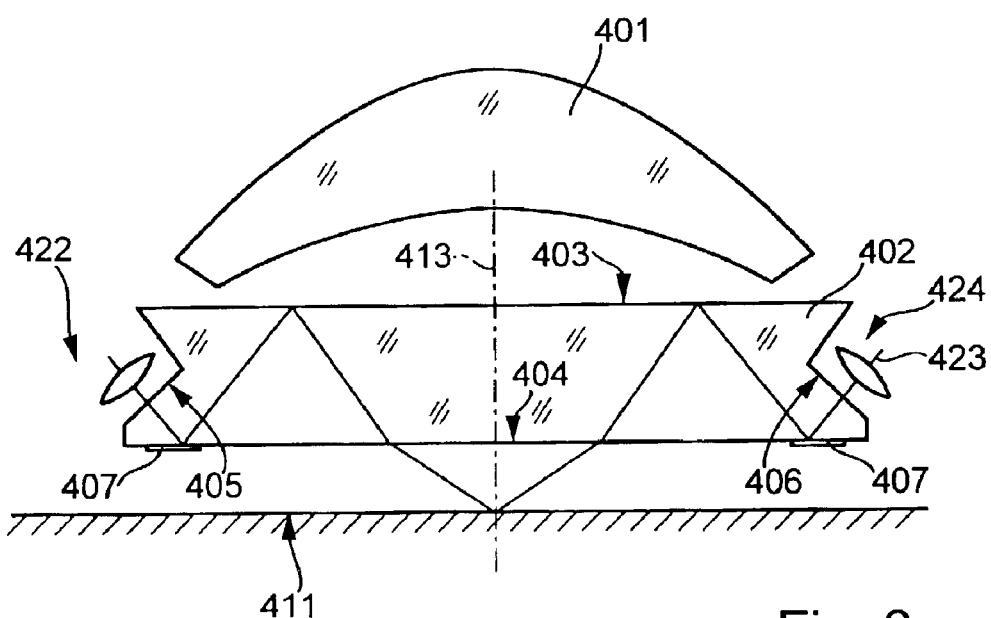
FIG. 6 is a schematized depiction of part of a fifth embodiment of a focus-detection system according to the invention.

Further opportunities for overcoming the coupling of the lens' high aperture ratio and the associated short working distance, to the angular range covered by the focus-detection system will be discussed, based on FIGS. 6 and 7. In the case of the embodiment depicted there, the image end of the photolithographic lens is a transmitting component of the focus-detection system that guides the measuring beam. The image-end of the lens shown in FIG. 6 has a positive meniscus lens 401 having a concave surface on its image side as its next-to-last optical element and a plane-parallel plate 402 having a planar entry face 403 and a planar exit face 404 that is to be arranged at a short distance from the upper surface 411 of the substrate as its final element. A planar, beveled, input-coupling surface 405 and a planar, beveled, output-coupling surface whose normals are aligned parallel to the direction of incidence or departure of the measuring beam 423, respectively, are provided near the edges of that plate 402. The input-coupling optics 422 guides the measuring beam onto the input-coupling surface 405 at normal incidence and into the plate 402, where it strikes a reflective coating 407 that reflects at the wavelength employed for measurement that has been applied to the plate's exit face 404 and is reflected in the direction of the its entry face 403. Following its reflection at that entry face, the measuring beam propagates in the direction of the upper surface 411 of the wafer, is coupled out of the plate 402 at its exit face 404, and strikes the center of the upper surface 411 of the substrate in the vicinity of the optical axis 413. The remainder of the beam path is symmetric with respect to the optical axis and, following coupling of the measuring beam into the plate 402, leads to the plate's entry face 403, where another reflective coating 407 reflects it along an exit direction that is normal to the input-coupling surface 406 and into the output-coupling optics 424. The lenses of the input-coupling optics 422 and output-coupling optics 424 are configured such that the compensate for any astigmatism that may occur. It should be obvious that this zigzag beam path within the plate 402 may be achieved, in spite of the short working distance and the near-grazing incidence on the upper surface 411 of the substrate.

In the case of this particular embodiment, the exit face 404 of the plate 402 serves as an auxiliary reflecting surface that reflects a measuring beam that is obliquely incident on the substrate's upper surface away from the substrate's upper surface in order to allow achieving this zigzag measuring-beam path. Such systems are particularly useful in conjunction with projection lenses that have high aperture ratios, for example, aperture ratios of unity or more.

Figure 7:
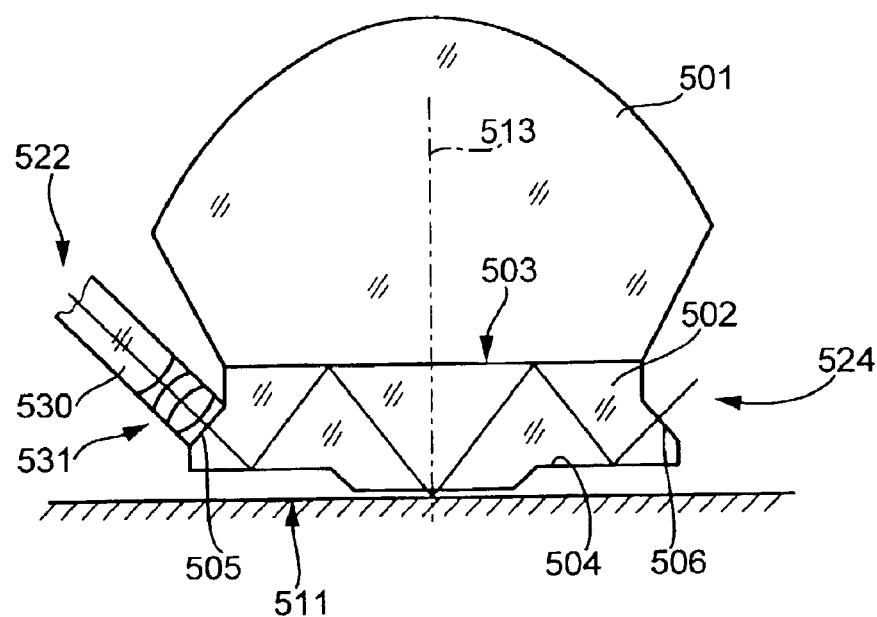
FIG. 7 is a schematized depiction of part of a sixth embodiment of a focus-detection system according to the invention.

FIG. 7 depicts an embodiment that has been especially adapted for use in immersion photolithography and/or near-field photolithography, where typical working distances may be of order of the operating wavelength or less. The lens has a large-diameter plano-convex lens 501 having a spherical entry surface as its final optical component. A plane-parallel plate 502 is optically contacted onto its planar exit surface. Although its contacting surface 503 is, in the optically contacted condition, transparent to the light employed for exposure, which has a wavelength of, for example, 193 nm or 157 nm, it reflects light at the measuring wavelength, e.g., 633 nm, which allows keeping the angular ranges occurring within the path of the measuring beam smaller than those that occur in the path of the light employed for exposure. The planar plate 402 has a beveled input-coupling surface 505 and a beveled output-coupling surface on its reverse side and a stepped exit face 504 whose central area near the optical axis 513 is closer to the upper surface 511 of the substrate than areas in the vicinity of its edges.

As explained above, the oblique arrangement of the input-coupling surface 505 causes aberrations, since the object will normally be situated in air or some other gas and its image will be in an optical material, such as synthetic quartz glass. These problems may be minimized if most of the path traversed by the measuring beam lies within an optically thick medium, where, for example, 80% or more of the path that the measuring beam traverses might pass through such a medium. In the case of the example shown, the input-coupling optics 522 have a glass block 530 fabricated from glassy silicon dioxide that has collimating optics 531 attached to its exit face. These telecentric collimating optics 531 have lenses fabricated from a material, for example, LaFSF or SF, that has a higher refractive index than quartz glass. All of its optical components are cemented together to form a monolithic structure. Since, in this case, only the ratio of the refractive index of the material from which the collimating optics are fabricated to that of the material of the glass block is of any importance, the effects of aberrations introduced by the prismatic plate 502 may be largely eliminated. The output-coupling optics 524 may have a similar configuration.

Figure 8:
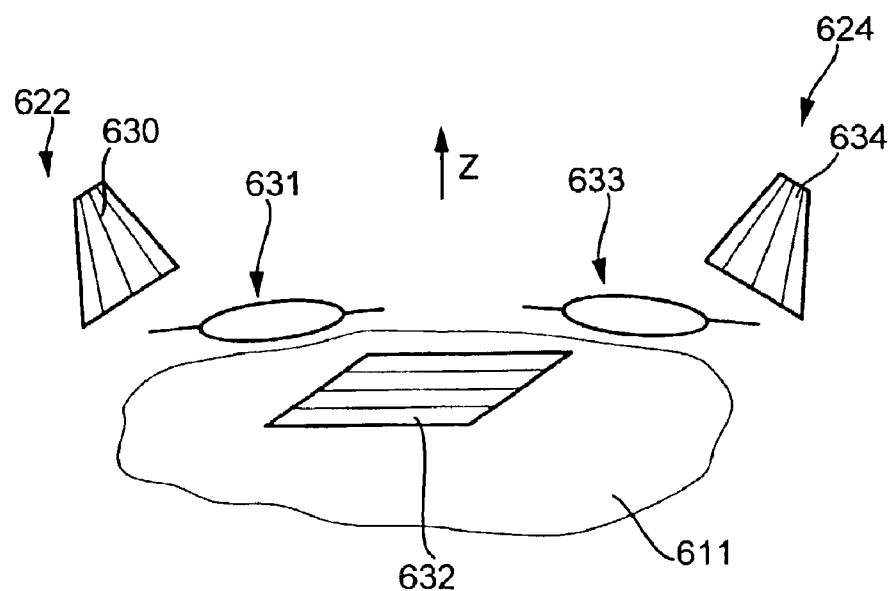
FIG. 8 is a schematized depiction of part of an embodiment of a focus-detection system for performing measurements employing moiré fringe patterns.

Focus-detection systems according to the invention are suitable for use with all types and shapes of objects to be imaged. For example, slit-shaped objects, i.e., objects that are spatially extended in essentially a single dimension only, may be employed. It will be particularly beneficial if an entire two-dimensional grid is imaged onto the upper surface of the substrate, in which case, it will be possible to, for example, significantly improve analytical precision by employing moiré techniques and analyses extending over extended areas, i.e., analyses encompassing two mutually orthogonal directions, as will be explained based on FIG. 8, which schematically depicts a section of a surface 611 of a substrate, an input-coupling system 622, and an output-coupling system 624. The input-coupling system includes an object grid 630 that is obliquely imaged onto the substrate's surface 611 by an imaging lens 631 such that an image 632 of the object grid 630 appears thereon. That image is imaged onto an analysis grid 634 by the output-coupling system's imaging optics 633. Superimposing the image of the object grid 630 reflected at the substrate's surface 611 on the analysis grid 634 allows creating moiré fringe patterns that may be analyzed in order to determine the location of the substrate's surface 611.

The lenses 631 and 633 beneficially have their principal planes arranged parallel to the plane of the wafer. Ignoring errors, such as curvature or tilt, the signal behind the analysis grid will be strictly sinusoidal and correspond to the z-position of the substrate's surface 611, which will allow a point-by-point analysis of the data. However, it will be even more beneficial if the superposition pattern is analyzed over at least some portion of its area, i.e., in two dimensions and spatially resolved, rather than merely acquiring a single brightness level. The detector employed, which has not been shown, may thus have, e.g., a CCD-chip. All information, such as the focus location and any tilt and/or curvature of the wafer or substrate's surface 611, will be contained in the resultant two-dimensional image and may be analyzed. Periodically shifting the object grid and analysis grid relative to one another will allow generating a phase shift in order to minimize any residual errors. For example, the object grid 630 might be vibrated by a piezoelectric transducer.

Grazing angles of incidence, such as those allowed by the invention, are beneficial in the case of these high-precision analytical methods. The imaging systems of the input-coupling system and output-coupling system should allow extremely wide field angles and be thoroughly corrected for distortion and other imaging errors, where it will be beneficial to employ other configurations wherein the principal planes are not parallel to the plane of the wafer. Beneficial are, for example, arrangements in which the lenses 631 and 633 of the input-coupling system and output-coupling system are highly telecentric and allow 1:1 imaging. The planes of the object grid and analysis grid will beneficially intersect the plane 611 of the wafer and the principal planes of the lenses 6e1 and 633 at a point.

The lenses 631 and 633 have imaging that exhibits trapezoidal distortion due to the off-axis arrangement of the surface 611 of the substrate. Trapezoidal object grids 630 and analysis grids 634 are preferably employed in order to obtain a rectangular grid on the substrate's surface 611. If the perspective distortions of the object grid and analysis grid have been correctly adapted to suit the angle of incidence, then a rectangular image 632 of the object grid that is sharply focused all over will be created on the substrate's surface 611, but will be trapezoidal once again when it is imaged onto the analysis grid. If the focal lengths of the lenses 631 and 633 are equal, the analysis grid may agree with the object grid in dimensions and layout, which, among other things, will allow inexpensively fabricating grids of this type. Grids that have several periodicity directions in order to allow creating, e.g., a cross-hatched grid, on the wafer's surface 611 may also be employed instead of the linear grids with grid lines that converge or diverge along a given direction that are shown.

Employing interferometric techniques provides yet another opportunity for improving metric responsivity.

Another preferred embodiment thus provides that the input-coupling system incorporates a collimated (laser) beam that has been collimated using imaging optics that traverses the measuring area and ultimately, after several reflections, reaches the output-coupling system, where the input-coupling system and output-coupling system may be identical. A reference beam is formed from the entering beam at a suitable location beforehand. The exiting beam is brought into interference with the reference beam, and the phases of the reference beam and measuring beam may be determined from the intensity modulation. For example, high-frequency phase shifts will allow extremely accurately and rapidly determining the optical path of the measuring beam in the measuring area. Since the light employed is employed for detecting changes in optical path lengths, rather than angular displacements, grazing incidence on the substrate is less beneficial. Guiding the measuring beam along a zig-zag path allows employing near-normal incidence. Another improvement at extremely high aperture ratios and extremely short working distances may be achieved by providing a thick plane-parallel plate as the final reflective optical element of the photolithographic projection lens. The polarization state orthogonal to the plane of incidence is particularly beneficial in the case of interferometric techniques.

What is claimed is:

1. A method for optically detecting deviations of the image plane of an optical imaging system from the substrate surface of a substrate to be arranged in the vicinity of the image plane comprising:
   generating at least one measuring beam of measuring light;
   obliquely irradiating an intermediate zone situated between a final optical surface of the imaging system and the substrate surface with the measuring beam;
   detecting the measuring beam subsequent to reflection of the measuring beam at the substrate surface;
   wherein the optical imaging system has an image side numerical aperture $NA \geq 0.80$, and
   wherein that irradiation is carried out such that the measuring beam is reflected at least once at the substrate surface and at least once at a reflecting surface of the imaging system that reflects the measuring light, prior to detection of the measuring beam.

2. A method according to claim 1, wherein the measuring beam is routed such that it is reflected only once at the substrate surface.

3. A method according to claim 1, wherein the measuring beam is reflected at least once at an auxiliary reflecting surface arranged ahead of, and at a distance from, the substrate surface, the auxiliary surface being adapted for reflecting a measuring beam obliquely directed toward the substrate surface obliquely away from the substrate surface.

4. A method according to claim 3, wherein the optical imaging system comprises a final optical component having a surface acting as the auxiliary reflecting surface and wherein the measuring beam is reflected at least once at the auxiliary reflecting surface of the final optical component.

5. A method according to claim 1 comprising:
   obliquely coupling the measuring beam into a transparent optical component of the optical imaging system that has planar interfaces, wherein the measuring beam is coupled into the optical component such that the measuring light is reflected at at least one planar interface of the optical component before exiting the optical component.

6. A method according to claim 5, wherein the measuring beam is coupled into the optical component such that the measuring light is reflected at at least two planar interfaces of the optical components before being coupled out of the optical component.

7. A method according to claim 1, wherein the measuring beam is routed such that a measuring path involving at least one reflection at the substrate surface and at least one reflection at a reflecting surface of the optical imaging system is traversed several times prior to detection.

8. A method according to claim 1, wherein the measuring light has a preferred polarization direction.

9. A method according to claim 8, wherein the measuring light has a preferred polarization direction that is approximately orthogonal to a plane of incidence on the substrate surface and the reflecting surface.

10. A method according to claim 5, wherein the measuring light is routed such that more than 80% of a path traversed by the measurement beam between entry into the transparent optical component and exit out of the transparent optical component lies within an optically thick medium.

11. A method according to claim 1, wherein the measuring beam is used to create a two-dimensional image of a grid on the substrate surface.

12. A method according to claim 1, wherein an object grid having a perspective distortion adapted to suit a particular angle of incidence is used to create an image of the object grid at a reflecting location on the substrate surface, and wherein an analyzing grid having a perspective distortion is employed for analyzing the image of the object grid, wherein the perspective distortions of the object grid and the analyzing grid are adapted to suit one another such that superimposing the image of the object grid on the analyzing grid will allow creating a Moiré-fringe pattern.

13. A method according to claim 12, wherein a trapezoidally distorted object grid and a trapezoidally distorted analyzing grid are employed.

14. An imaging device comprising:
   an optical imaging system having an image side numerical aperture $NA \geq 0.80$; and
   a focus-detection system for optically detecting deviations of the image plane of an optical imaging system from the surface of a substrate to be arranged in the vicinity of the image plane, the focus-detection system comprising:
      an input-coupling system for coupling in at least one measuring beam of measuring light provided for reflection on the substrate surface obliquely into an intermediate zone located between the final optical surface of the imaging system and the substrate surface; and
      an output-coupling system for coupling the measuring beam out and detecting the measuring beam subsequent to reflection at the substrate surface, wherein the input-coupling system and the output-coupling system are configured such that the measuring beam is reflected at least once at the substrate surface and at least once at a reflecting surface of the imaging system that reflects the measuring light before the measuring beam enters the output-coupling system.

15. An imaging device according to claim 14 comprising at least one auxiliary reflecting surface arranged ahead of, and at a distance from, the substrate surface, the auxiliary surface being adapted for reflecting a measuring beam obliquely directed toward the substrate surface obliquely away from the substrate surface.

16. An imaging device according to claim 15 comprising at least one auxiliary reflecting surface arranged between a plane defined by an exit surface of the optical imaging system and the image plane of the optical imaging system.

17. An imaging device according to claim 15, wherein at least one auxiliary reflecting surface is provided at the final optical surface of the optical imaging system.

18. An imaging device according to claim 14, wherein a final optical component of the optical imaging system has an exit surface having at least one section having a coating adapted for reflecting the measuring light.

19. An imaging device according to claim 18, wherein the coating reduces reflectance at the operating wavelength of the optical imaging system.

20. An imaging device according of claim 14, wherein the focus-detection system has at least one retroreflector for retroreflecting the measuring beam.

21. An imaging device according to claim 14, wherein the input-coupling system is configured to yield polarized measuring light.

22. An imaging device according to claim 14 comprising at least one polarization rotator for rotating a preferred polarization direction of the measuring light situated between a first transit of a measurement path and a subsequent, second, measurement path that is transited in the opposite direction.

23. An imaging device according to claim 14, wherein the focus-detection system includes a final optical component of the optical imaging system as a transmitting, beam-guidance component for the measuring beam.

24. An imaging device according to claim 14, wherein the optical imaging system has at least one final optical component that has a boundary zone, wherein a planar surface that is inclined with respect to the optical axis of the final optical component is formed on at least one section of the boundary zone, the planar surface being provided for the purpose of coupling in the measuring beam of the focus-detection system.

25. An imaging device according to claim 14, wherein the input-coupling system includes an object grid that is imaged onto the substrate surface using imaging optics and the output-coupling system includes an analyzing grid and an optical imaging system for imaging the grid imaged onto the substrate surface onto the analyzing grid, wherein the object grid and analyzing grid are adapted to suit one another such that superimposing the image of the object grid onto the analyzing grid will allow creating a moiré fringe pattern.

26. An imaging device according to claim 25, wherein the object grid and the analyzing grid are trapezoidally distorted.

27. An imaging device according to claim 14, wherein the focus-detection system has a spatially resolving detector having a two-dimensional sensing surface.

28. A method for optically detecting deviations of the image plane of an optical imaging system from the substrate surface of a substrate to be arranged in the vicinity of the image plane comprising:
    generating at least one measuring beam of measuring light;
    obliquely irradiating an intermediate zone situated between a final optical surface of the imaging system and the substrate surface with the measuring beam;
    detecting the measuring beam subsequent to reflection of the measuring beam at the substrate surface;
    wherein that irradiation is carried out such that the measuring beam is reflected at least once at the substrate surface and at least once at a reflecting surface of the imaging system that reflects the measuring light, prior to detection of the measuring beam, and
    wherein an object grid having a perspective distortion adapted to suit a particular angle of incidence is used to create an image of the object grid at a reflecting location on the substrate surface, and wherein an analyzing grid having a perspective distortion is employed for analyzing the image of the object grid, wherein the perspective distortions of the object grid and the analyzing grid are adapted to suit one another such that superimposing the image of the object grid on the analyzing grid will allow creating a Moiré-fringe pattern.

29. A method according to claim 28, wherein a trapezoidally distorted object grid and a trapezoidally distorted analyzing grid are employed.

30. A method according to claim 28 comprising:
    obliquely coupling the measuring beam into a transparent optical component of the optical imaging system that has planar interfaces, wherein the measuring beam is coupled into the optical component such that the measuring light is reflected at at least one planar interface of the optical component before exiting the optical component.

31. A method according to claim 30, wherein the measuring beam is coupled into the optical component such that the measuring light is reflected at at least two planar interfaces of the optical components before being coupled out of the optical component.

32. A method according to claim 28, wherein the measuring beam is routed such that a measuring path involving at least one reflection at the substrate surface and at least one reflection at a reflecting surface of the optical imaging system is traversed several times prior to detection.

33. A method according to claim 28, wherein the measuring light has a preferred polarization direction.

34. An imaging device having an optical imaging system and a focus-detection system for optically detecting deviations of the image plane of an optical imaging system from the surface of a substrate to be arranged in the vicinity of the image plane, the focus-detection system comprising:
    an input-coupling system for coupling in at least one measuring beam of measuring light provided for reflection on the substrate surface obliquely into an intermediate zone located between the final optical surface of the imaging system and the substrate surface; and
    an output-coupling system for coupling the measuring beam out and detecting the measuring beam subsequent to reflection at the substrate surface, wherein the input-coupling system and the output-coupling system are configured such that the measuring beam is reflected at least once at the substrate surface and at least once at a reflecting surface of the imaging system that reflects the measuring light before the measuring beam enters the output-coupling system,
    wherein the input-coupling system includes an object grid that is imaged onto the substrate surface using imaging optics and the output-coupling system includes an analyzing grid and an optical imaging system for imaging the grid imaged onto the substrate surface onto the analyzing grid, wherein the object grid and analyzing grid are adapted to suit one another such that superimposing the image of the object grid onto the analyzing grid will allow creating a moire fringe pattern.

35. An imaging device according to claim 34, wherein the object grid and the analyzing grid are trapezoidally distorted.

36. An imaging device according to claim 34 comprising at least one auxiliary reflecting surface arranged ahead of, and at a distance from, the substrate surface, the auxiliary surface being adapted for reflecting a measuring beam obliquely directed toward the substrate surface obliquely away from the substrate surface.

37. An imaging device according to claim 36 comprising at least one auxiliary reflecting surface arranged between a plane defined by an exit surface of the optical imaging system and the image plane of the optical imaging system.

38. An imaging device according to claim 36, wherein at least one auxiliary reflecting surface is provided at the final optical surface of the optical imaging system.

39. An imaging device according to claim 34, wherein a final optical component of the optical imaging system has an exit surface having at least one section having a coating adapted for reflecting the measuring light.

40. An imaging device according to claim 39, wherein the coating reduces reflectance at the operating wavelength of the optical imaging system.

41. An imaging device according of claim 34, wherein the focus-detection system has at least one retroreflector for retroreflecting the measuring beam.

42. An imaging device according to claim 34, wherein the input-coupling system is configured to yield polarized measuring light.

43. An imaging device according to claim 34 comprising at least one polarization rotator for rotating a preferred polarization direction of the measuring light situated between a first transit of a measurement path and a subsequent, second, measurement path that is transited in the opposite direction.

44. An imaging device according to claim 34, wherein the focus-detection system includes a final optical component of the optical imaging system as a transmitting, beam-guidance component for the measuring beam.

45. An imaging device according to claim 34, wherein the optical imaging system has at least one final optical component that has a boundary zone, wherein a planar surface that is inclined with respect to the optical axis of the final optical component is formed on at least one section of the boundary zone, the planar surface being provided for the purpose of coupling in the measuring beam of the focus-detection system.

* * * * *